Aug. 29, 1967 J. FRANKS 3,339,074
SOLID STATE IMAGE CONVERTING DISPLAY DEVICE
Filed Dec. 10, 1964
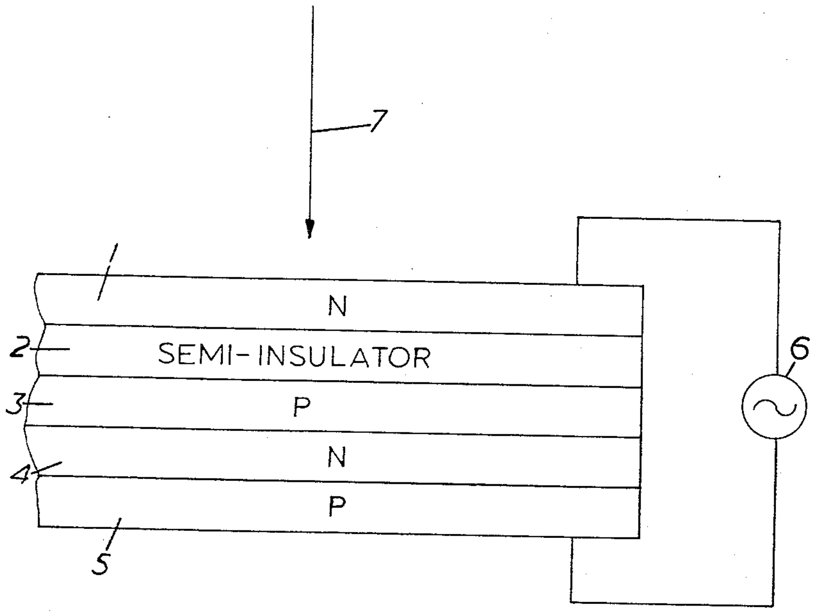
*Inventor*
JOSEPH FRANKS
By Percy P. Lantzy
*Attorney*

United States Patent Office 3,339,074
Patented Aug. 29, 1967

3,339,074

SOLID STATE IMAGE CONVERTING DISPLAY DEVICE

Joseph Franks, London, England, assignor to International Standard Electric Corporation, New York, N.Y., a corporation of Delaware Filed Dec. 10, 1964, Ser. No. 417,308
Claims priority, application Great Britain, Dec. 24, 1963, 50,883/63
4 Claims. (Cl. 250—213)

ABSTRACT OF THE DISCLOSURE

A semiconductor display device for converting incident infra-red radiation to visible light. The device incorporates multi-layer construction in which adjacent gallium arsenide N-semi-insulating-P layers form an infra-red radiation sensitive "switch" in which the N-type layer is substantially transparent to the infra-red radiation, while the semi-insulating layer is photoconductive in response to said radiation; a layer of N-type gallium phosphide is situated adjacent the P-type gallium arsenide layer so that a P-N heterojunction is formed therebetween. A P-type gallium phosphide layer is disposed on the N-type gallium phosphide layer so that the P-N junction therebetween is capable of emitting visible light when the current across said junction exceeds a threshold value. Infra-red radiation incident upon the gallium arsenide "switch" lowers the effective series resistance between the gallium phosphide light emitting junction and an external source of bias voltage, thus resulting in a current increase (above the threshold value) across the light emitting junction with resultant radiation of visible light therefrom in response to infra-red radiation incident upon the gallium arsenide layer.

This invention relates to solid state display devices.

According to the invention a solid state display device includes a multi-layer sheet of material which includes radiation responsive photoconductive layers adjacent electro-luminescent phosphor layers, the photo-conductive and phosphor layers being placed between transparent electrode layers, and means for applying an electric potential between the electrode layers.

In a preferred embodiment of the invention a solid state display device includes a multi-layer sheet of material which includes a layer of n-type gallium arsenide, a layer of semi-insulating gallium arsenide, a layer of p-type gallium arsenide, a layer of n-type gallium phosphide and a layer of p-type gallium phosphide and means for applying an electric potential between the first and last mentioned layers. Semi-insulating materials are well known in the art as exemplified in Patents 3,283,160 and 3,304,471.

In solid state display devices such as those described above if the photo-conductive material is biased by a D.C. potential and a small current is induced to flow by photo excitation or by a combination of photo excitation and injection, an unstable condition is reached and the material switches to a new state passing a larger current from the same voltage. If a large sheet of such material has a spot of light focused upon it to produce the unstable condition then any electro-luminescent phosphor adjacent the illuminated spot will be triggered by the increased current and will emit light.

The use of a D.C. bias enables the multi-layer sheet to act as a static image converter, or memory. If, however, an A.C. bias is used then a series of images at the A.C. frequency can be obtained. Provided the A.C. frequency exceeds approximately 25 cycles per second a flicker-free moving picture will be obtained.

A preferred embodiment of the invention will now be described with reference to the drawing accompanying the provisional specification, which illustrates a part section through a multi-layer image converter sheet.

The multi-layer sheet consists of a layer of n-type gallium arsenide 1, a layer of semi-insulating gallium arsenide 2, a layer of p-type gallium arsenide 3, a layer of n-type gallium phosphide 4 and a layer of p-type gallium phosphide 5, in that order. The layer of n-type gallium arsenide 1 acts as an electrode transparent to radiation in the infra-red spectrum. The layer of semi-insulating gallium arsenide 2 forms a triggering photo-conductor, and the layer of p-type gallium arsenide 3 provides a hole injecting electrode. The junction region between the layer of n-type gallium phosphide 4 and the layer of p-type gallium phosphide 5 is formed as a light emitting junction and the p-type layer 5 acts also as an electrode transparent to the light emitted from the junction.

The layers 1 and 5, which act as transparent electrodes, are connected across an A.C. source 6.

If the multi-layer sheet is exposed to infra-red radiation 7 the incident radiation initiates the change in the conductivity of the photo-conductor, the bulk of the free carriers causing the change being supplied by the bias source 6, and not by photo-excitation. This property is observed in high energy gap material such as gallium arsenide, when its conduction properties are determined by a level near the centre of the energy gap. If the trap population and capture cross section ratio for holes and electrons are such, that for low levels of injection the lifetimes of the carriers are very different, a negative region exists in the voltage region current characteristics at higher levels of injection, and the material switches to a high conductivity state. In the case of gallium arsenide this behaviour is governed by the concentration of holes, which may either be injected by the electrode or produced by photo-excitation. Thus if a current of, say, 50 $\mu$a., can be induced to flow in semi-insulating gallium arsenide by photo-excitation or by a combination of photo-excitation and injection, an unstable condition is reached, and the material switches to a new state passing, say, 5 ma. for the same voltage. A triggered photo-conductor of this type combined with a low voltage electro-luminescent phosphor, such as gallium phosphide, provides a means of achieving image conversion at wavelengths in the region of 1 micron.

With a gallium-arsenide, gallium phosphide combination dark current is not very critical because of the non-linear characteristics of gallium phosphide.

The A.C. bias source is of the order of 50 volts and the frequency is determined by the requirements to be made. Thus, as has been pointed out above, for flicker free image conversion the frequency should exceed approximately 25 cycles per second. If the A.C. bias current is, for example, a sine wave current variation in the brightness of the object is reproduced in the image, because switching occurs earlier for the brighter sources.

In a practical application an image converter comprises a multi-layer sheet of material as described above which is placed at one end of a light-tight housing, the other end of the housing containing a lens. The arrangement is analogous to the ground glass sheet utilized in a conventional plate camera for focussing purposes, except that in this case the sheet converts the focussed image from an invisible infra-red image to a visible light image. The A.C. power supply may be contained separately in a portable pack carried by the operator.

The layers of gallium arsenide and gallium phosphide may be deposited by epitaxial techniques and the completed layer may be supported by a transparent substrate which may or may not form part of one of the above mentioned layers.

It is to be understood that the foregoing description of specific examples of this invention is made by way of example only and is not to be considered as a limitation on its scope.

What I claim is:

1. A solid state display device, comprising:

a first layer of gallium arsenide semiconductor material of one conductivity type, said layer being substantially transparent to incident infra-red radiation;

a second layer of substantially semi-insulating gallium arsenide on said first layer, said second layer being photoconductive in response to said infra-red radiation;

a third layer of gallium arsenide semiconductor material of opposite conductivity type to that of said first layer on said second layer;

a fourth layer of gallium phosphide semiconductor material of said one conductivity type of said third layer, said third and fourth layers forming a P-N junction at the interface therebetween;

a fifth layer of gallium phosphide semiconductor material of said opposite conductivity type on said fourth layer, said fourth and fifth layers forming a light-emitting P-N junction at the interface therebetween, such that said light-emitting junction radiates visible light when a current in excess of a given threshold value traverses said light-emitting junction, said fifth layer being substantially transparent to said visible light; and means including conductors to said first and fifth layers for applying a bias voltage between said first and fifth layers such that said current is less than said threshold value in the absence of a predetermined quantity of said infra-red radiation, so that when exposed to a quantity of said radiation in excess of said predetermined quantity through said first layer, the conductivity of said second layer increases sufficiently to raise said current above said threshold value whereby said visible light is radiated from said light-emitting junction in response to said incident infra-red radiation.

2. A device according to claim 1, wherein said layers are formed by epitaxial deposition.

3. A device accordilng to claim 1, wherein said bias means comprises a source of alternating voltage.

4. A device according to claim 1, wherein said bias means comprises a source of unidirectional voltage.

References Cited

UNITED STATES PATENTS

| | | | |
|---|---|---|---|
| 3,131,305 | 4/1964 | Shombert | 250—211 X |
| 3,170,067 | 2/1965 | Kibler | 250—211 |
| 3,200,259 | 8/1965 | Braunstein | 307—88.5 |
| 3,267,294 | 8/1966 | Dumke et al. | 313—108 X |
| 3,270,235 | 8/1966 | Loebner | 250—217 |
| 3,283,160 | 11/1966 | Levitt et al. | 313—108 X |

OTHER REFERENCES

Dill: Light Coupled Transistor; IBM Technical Disclosure Bulletin, vol. 6, No. 5; October 1963, p. 73.

WALTER STOLWEIN, *Primary Examiner.*